United States Patent
Furukawa

(10) Patent No.: US 7,154,092 B2
(45) Date of Patent: Dec. 26, 2006

(54) METHOD OF THREE-DIMENSIONAL IMAGE RECONSTRUCTION AND TRANSMISSION ELECTRON MICROSCOPE

(75) Inventor: Hiromitsu Furukawa, Nerima (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 11/206,363

(22) Filed: Aug. 18, 2005

(65) Prior Publication Data
US 2006/0038127 A1   Feb. 23, 2006

(30) Foreign Application Priority Data
Aug. 20, 2004   (JP)   ............................. 2004-240832

(51) Int. Cl.
*G21K 7/00*   (2006.01)
(52) U.S. Cl. .................. 250/311; 250/440.11; 250/306; 250/307
(58) Field of Classification Search ...................... None
See application file for complete search history.

(56) References Cited

U.S. PATENT DOCUMENTS

| 5,278,408 A | 1/1994 | Kakibayashi et al. |
| 6,051,834 A * | 4/2000 | Kakibayashi et al. ........ 250/311 |

FOREIGN PATENT DOCUMENTS

| JP | 4-104445 | 4/1992 |
| JP | 4-337236 | 11/1992 |

* cited by examiner

*Primary Examiner*—Nikita Wells
*Assistant Examiner*—Zia R. Hashmi
(74) *Attorney, Agent, or Firm*—The Webb Law Firm

(57) ABSTRACT

Method of three-dimensional image reconstruction and transmission electron microscope capable of producing three-dimensional images. When a TEM image is taken at each tilt angle of a specimen, the amount of defocus $\Delta f$ is switched to plural amounts $\Delta f_1$, $\Delta f_2$, and $\Delta f_3$, in turn. When a three-dimensional image is reconstructed, image data stored in the image memory is sent to a CRT. TEM images acquired with the amounts $\Delta f_1$, $\Delta f_2$, and $\Delta f_3$ are displayed on the CRT. One optimum TEM image is selected at each tilt angle of the specimen. A three-dimensional image reconstruction circuit reconstructs a three-dimensional image based on the selected TEM images.

3 Claims, 1 Drawing Sheet

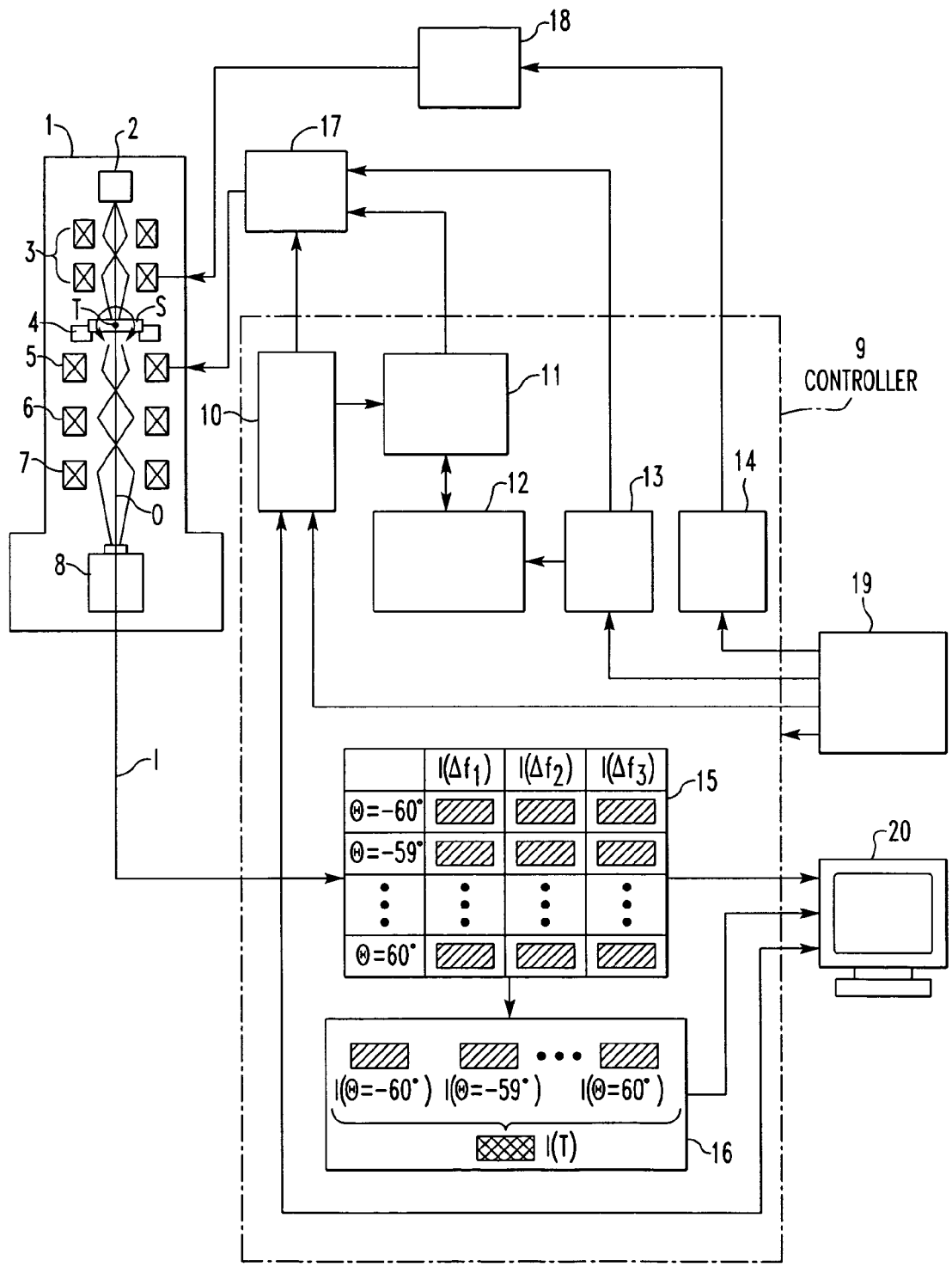

METHOD OF THREE-DIMENSIONAL IMAGE RECONSTRUCTION AND TRANSMISSION ELECTRON MICROSCOPE

BACKGROUND OF THE INVENTION

1. Field of the Invention

The present invention relates to method of three-dimensional (3D) image reconstruction and transmission electron microscope for obtaining three-dimensional images of specimens.

2. Description of Related Art

Today, transmission electron microscopes are receiving attention as apparatus capable of obtaining three-dimensional (3D) images of specimens. In such a transmission electron microscope equipped with a function of reconstructing a 3D image of a specimen, the specimen is tilted. TEM images are gained at various tilt angles of the specimen, and a CT (computerized tomography) method is applied to the gained TEM images to reconstruct a 3D image of the specimen.

It is known that in order to have a TEM image with good contrast, it is better to slightly shift the focal point of the objective lens from the positive focal point lying on the specimen. Accordingly, in a transmission electron microscope having the prior art function of reconstructing 3D images, to image a TEM image with good contrast at each tilt angle of specimen, the following process steps (1) and (2) have been performed at each tilt angle.

(1) The position of the positive focal point of the objective lens is detected.

(2) The position of the focus of the objective lens is set to a position deviating from the position of the positive focal point by a fixed amount of defocus $\Delta f$. At this set focal point, a TEM image is taken.

The process steps (1) and (2) above are described, for example, in Japanese Patent Laid-Open No. H4-104445. A transmission electron microscope for obtaining 3D images is described, for example, in Japanese Patent Laid-Open No. H4-337236.

It is considered that the amount of defocus $\Delta f$ (the amount of deviation of the focus from the positive focal point) occurring during imaging greatly affects the image quality of the obtained TEM image. Especially, where the specimen is tilted, it is considered that the optimum amount of defocus varies depending on the tilt angle because the apparent thickness of the specimen varies. It is also considered that the optimum amount of defocus is affected by the material of the specimen.

In the prior art, however, the amount of defocus $\Delta f$ is fixed. Even if the specimen is tilted, the same amount of focus $\Delta f$ is used.

SUMMARY OF THE INVENTION

It is an object of the present invention to provide a method of three-dimensional image reconstruction and a transmission electron microscope capable of obtaining three-dimensional images with better image quality than heretofore.

A method of three-dimensional image reconstruction that achieves the above-described object in accordance with the teachings of the present invention obtains a 3D image of a specimen by tilting the specimen at plural tilt angles, gaining a TEM image at each of the tilt angles, and reconstructing the 3D image of the image based on the gained TEM images. At each tilt angle of the specimen, the following process steps (a) and (b) are carried out.

(a) The position of the positive focal point of the objective lens of the transmission electron microscope is detected.

(b) The position of the focus of the objective lens is set to plural positions deviating from the position of the positive focal point by amounts of defocus $\Delta f_1, \ldots, \Delta f_n$, respectively. At each of these set focal point positions, a TEM image is acquired.

One optimum TEM image is selected from the TEM images gained by the process steps (a) and (b) at each tilt angle of the specimen. A 3D image of the specimen is reconstructed based on the selected TEM images.

Consequently, according to the present invention, 3D images with better image quality than heretofore can be obtained.

Other objects and features of the invention will appear in the course of the description thereof, which follows.

BRIEF DESCRIPTION OF THE DRAWING

The drawing is a block diagram of a transmission electron microscope of the present invention.

DESCRIPTION OF THE PREFERRED EMBODIMENTS

The preferred embodiment of the present invention is hereinafter described with reference to the accompanying drawing.

The drawing shows a transmission electron microscope having a function of reconstructing a three-dimensional image according to the present invention. The structure of this instrument shown in the drawing is first described.

In the drawing, the inside of a vacuum chamber 1 is evacuated to a high degree of vacuum by a pumping system. A condenser lens 3, a tilting stage 4, an objective lens 5, an intermediate lens 6, a projector lens 7, and a TV camera 8 are arranged in this order from the side of an electron gun 2 inside the chamber 1. The tilting stage 4 can tilt right and left about an axis of tilt T substantially perpendicular to the optical axis O. A specimen S is placed on the tilting stage 4.

In this way, the various electron-optical components are disposed inside the vacuum chamber 1. The electron beam emitted from the electron gun 2 is focused by the condenser lens 3 and made to hit the specimen S. The electron beam transmitted through the specimen S is focused by the objective lens 5. An initial stage of image of the specimen S is formed between the objective lens 5 and the intermediate lens 6. Then, a magnified image of the specimen is formed by the intermediate lens 6 and projector lens 7. Finally, a magnified image of the specimen, i.e., a TEM image, is focused onto the TV camera 8. The TV camera 8 taking the TEM image produces an image signal I indicative of the TEM image to a central controller 9.

This central controller 9 incorporates a positive focal point position-detecting circuit 10, a focal point position-setting circuit 11, a defocus amount storage circuit 12, a defocus amount-varying circuit 13, a tilting stage control circuit 14, an image memory 15, and a 3D image reconstruction circuit 16. The central controller 9 is electrically connected with an objective-lens power supply 17 for energizing the coils of the objective lens 5 with an excitation current i, a tilting stage driver 18 for tilting the tilting stage 4, input means 19 including a keyboard and a mouse (i.e., image selecting means), and a CRT 20 acting as a display means. The structure of the transmission electron microscope of FIG. 1 has been described so far.

The transmission electron microscope of FIG. 1 performs the three operations: (1) predetection of plural amounts of defocus $\Delta f_1, \ldots, \Delta f_n$, (2) automated acceptance of TEM images, and (3) selection of TEM images for reconstruction of a 3D image. These operations are described in succession below.

(1) Predetection of Plural Amounts of Defocus $\Delta f_1, \ldots, \Delta f_n$

First, the operator arbitrarily enters a tilt angle $\theta_1$ (e.g., −50°) of the tilting stage 4 from the input means 19. The tilting stage control circuit 14 receiving a tilt angle signal from the input means 19 sends a tilt signal $\theta_1$ (−50) for setting the tilt angle $\theta_1$ of the stage 4 to −50° to the tilting stage driver 18. On receiving this tilt signal $\theta_1$ (−50), the stage driver 18 tilts the tilting stage 4 by −50°.

When the specimen S is tilted by −50° in this way, the operator then enters an instruction from the input means 19 to "detect the position of the positive focal point". The positive focal point position-detecting circuit 10 receiving the instruction signal from the input means 19 sends an excitation signal for varying the objective lens current i in steps to the objective-lens power supply 17. The power supply 17 receiving the excitation signal varies the objective lens current i in steps.

As the excitation current i of the objective lens varies, the quality of the TEM image taken by the TV camera 8 varies. The variation of the image quality of the TEM image is recorded in the positive focal point position-detecting circuit 10. That is, the image signal I from the TV camera 8 is supplied to the positive focal point position-detecting circuit 10. TEM images taken at different values of the objective lens current are stored in the image memory of the positive focal point position-detecting circuit 10, together with the respective objective lens current values.

When the focal point of the objective lens 5 agrees with the positive focal point position, the contrast value of the TEM image is minimized. Accordingly, the positive focal point position-detecting circuit 10 image-processes each stored TEM image, finds the contrast value, and extracts a TEM image with a minimum contrast value. The detecting circuit 10 then detects the objective lens current value i ($f_1$) when the extracted TEM image is taken. The contrast value is found, for example, by image processing as described in Japanese Patent Laid-Open No. H4-104445.

When the objective lens current value i ($f_1$) is detected in this way (i.e., the positive focal point position $f_1$ at the tilt angle of −50°), the detecting circuit 10 sends information about the detected lens current value i ($f_1$) to the focal point position-setting circuit 11. The focal point position-setting circuit 11 sends an excitation signal for setting the objective lens current to i ($f_1$) to the objective-lens power supply 17. The objective-lens power supply 17 receiving this excitation signal sets the objective lens current to i ($f_1$).

Currently, the central controller 9 is supplying the image signal I from the TV camera 8 to the CRT 20. Therefore, a TEM image of the specimen S which is at the positive focal point and tilted by −50° is being displayed on the CRT 20. Because the image is derived from the specimen at the positive focal point, the TEM image displayed on the CRT 20 has poor image quality having no contrast.

Accordingly, the operator manipulates the "defocus amount knob" on the input means 19 to improve the image quality of the TEM image displayed on the CRT 20. In response to the manipulation, the defocus amount-varying circuit 13 sends an excitation signal for varying the objective lens current by $\Delta i$ in response to the amount of manipulation to the objective-lens power supply 17. The lens power supply 17 receiving the excitation signal varies the set value of the objective lens current from the present value of i ($f_1$) to i ($f_1$)+$\Delta i$. When a TEM image with better contrast and the best image quality is finally displayed on the CRT 20, the objective lens current is set to i ($f_1$)+$\Delta i$ ($f_1$).

Where the objective lens current is set to i ($f_1$)+$\Delta i$ ($f_1$) in this way, the focal point position of the objective lens 5 is set to a position which is deviated from the positive focal point position $f_1$ by amount of defocus $\Delta f_1$. If the optimum amount of defocus $\Delta i$ ($f_i$) at the tilt angle $\theta_1$=−50° is found in this way (i.e., the objective lens current $\Delta i$ ($f_i$) corresponding to this amount of defocus $\Delta f_1$), the current value $\Delta i$ ($f_i$) is stored as amount of defocus $\Delta f_1$ in the defocus amount storage circuit 12.

Predetection of the amount of defocus $\Delta f_1$ when the tilt angle of the specimen is 50 degrees ($\theta_1$=−50°) has been described so far. Subsequently, predetection of optimum amounts of defocus at other arbitrary tilt angles of specimen is similarly done. In the present embodiment, the number of the other arbitrary tilt angles is two. For example, the tilt angle of the specimen is set to 0° ($\theta_2$=0°). An optimum amount of defocus $\Delta f_2$ is predetected. What is found in practice is an objective lens current value $\Delta i$ ($f_2$) corresponding to $\Delta f_2$. Then, the tilt angle is set to 50° ($O_3$=50°), and an optimum amount of defocus $\Delta f_3$ is predetected. What is found in practice is an objective lens current value $\Delta i$ ($f_3$) corresponding to $\Delta f_3$.

(2) Automated Acceptance of TEM Images

To permit automated acceptance of TEM images, the operator enters data from the input means 19, for example, in order that the specimen be tilted from −60° to 60° in increments of 1° and that a TEM image be taken at each tilt angle (−60°, −59°, . . . , 0°, . . . , 59°, and 60°). The tilting stage control circuit 14 sends a tilting signal for setting the tilt angle of the stage 4 to −60° to the tilting stage driver 18. Therefore, the stage driver 18 tilts the tilting stage 4 by −60°.

When the specimen S is tilted by −60° in this way, the positive focal point position-detecting circuit 10 detects a positive focal point position $f_{-60}$ in the same way as in the foregoing process. That is, the detecting circuit 10 detects the objective lens current value i ($f_{-60}$) corresponding to the positive focal point position $f_{-60}$ and sends information about the lens current value i ($f_{-60}$) to the focal point position-setting circuit 11.

The focal point position-setting circuit 11 refers to the current values $\Delta i$ ($f_1$), $\Delta i$ ($f_2$), and $\Delta i$ ($f_3$) stored in the defocus amount storage circuit 12 and sends an excitation signal to the objective-lens power supply 17 to set the objective lens current to i($f_{-60}$)+$\Delta i(f_1)$ at first. The power supply 17 receiving the excitation signal sets the objective lens current to i($f_{-60}$)+$\Delta i(f_1)$. At this time, a TEM image is taken by the TV camera 8, and the image signal I from the camera 8 is sent to the image memory 15. The TEM image produced when the objective lens current is i($f_{-60}$)+$\Delta i(f_1)$, i.e., TEM image I ($\Delta f_1$) produced when the focal point of the objective lens 5 is shifted from the positive focal point position $f_{-60}$ by amount of defocus $\Delta f_1$, is stored in a corresponding manner to the tilt angle of −60° in the image memory 15.

Subsequently, the focal point position-setting circuit 11 sends an excitation signal for setting the objective lens current to i($f_{-60}$)+$\Delta i(f_2)$ to the objective-lens power supply 17, using the current value $\Delta i$ ($f_2$) stored in the defocus amount storage circuit 12. The power supply 17 receiving the excitation current sets the objective lens current to i($f_{-60}$)+$\Delta i(f_2)$. The TEM image produced when the objective lens current is i($f_{-60}$)+$\Delta i(f_2)$, i.e., the TEM image I ($\Delta f_2$)

produced when the focal point position of the objective lens 5 has been shifted from the positive focal point position $f_{-60}$ by amount of defocus $\Delta f_2$, is stored in the image memory 15 in a corresponding manner to the tilt angle of −60°.

Furthermore, the focal point position-setting circuit 11 sends an excitation current to the objective-lens power supply 17 to set the objective lens current to i ($f_{-60}$)+$\Delta$i ($f_3$), using the current value $\Delta$i ($f_3$) stored in the defocus amount storage circuit 12. The power supply 17 receiving the excitation signal sets the objective lens current to i ($f_{-60}$)+$\Delta$i ($f_3$). The TEM image produced when the objective lens current is i ($f_{-60}$)+$\Delta$i ($f_3$), i.e., TEM image I $\Delta$($f_3$) produced when the focal point position of the objective lens 5 is shifted from the positive focal point position $f_{-60}$ by amount of defocus $\Delta f_3$, is stored in the image memory 15, in a corresponding manner to the tilt angle of −60° of the specimen.

The automated acceptance of the TEM images I ($\Delta f_1$), I ($\Delta f_2$), and I ($\Delta f_3$) produced when the tilt angle of the specimen is −60° has been described so far. Subsequently, the TEM images I ($\Delta f_1$), I ($\Delta f_2$), and I ($\Delta f_3$) produced with amounts of defocus of $\Delta f_1$, $\Delta f_2$, and $\Delta f_3$ and tilt angles of from −59° to −60° are stored in a corresponding manner to the respective tilt angles in the image memory 15.

(3) Selection of TEM Image in 3D Image Reconstruction

The operator manipulates the input means 19 to give an instruction to "select a TEM image". The central controller 9 receiving the image selection instruction signal from the input means 19 reads out TEM image data stored in the image memory 15 and sends the data to the CRT 20. At this time, image data about the TEM images I ($\Delta f_1$), I ($\Delta f_2$), and I ($\Delta f_3$) obtained when the tilt angle is −60° are first sent to the CRT 20. As a result, the TEM images I ($\Delta f_1$), I ($\Delta f_2$), and I ($\Delta f_3$) of the specimen S tilted at an angle of −60° are displayed juxtapositionally on the CRT 20. The operator then selects one TEM image with the best image quality from the three TEM images using the input means 19. For example, if the TEM image I ($\Delta f_1$) is selected, the central controller 9 sends the image data about the TEM image I ($\Delta f_1$) produced at the tilt angle of −60° to the 3D image reconstruction circuit 16.

Subsequently, the operator similarly performs image selection regarding TEM images I ($\Delta f_1$), I ($\Delta f_2$), and I ($\Delta f_3$) obtained when the tilt angle is from −59° to 60°. One optimum TEM image at each tilt angle is stored in the 3D-image reconstruction circuit 16. The reconstruction circuit 16 reconstructs a three-dimensional image I (T) of the specimen S from the TEM images produced at the various tilt angles and selected by the operator by computerized tomography. Image data about the reconstructed three-dimensional image I (T) is read out by the central controller 9 and sent to the CRT 20. As a result, the three-dimensional image I (T) is displayed on the CRT 20. The operation of the transmission electron microscope shown in the drawing has been described so far.

In the inventive transmission electron microscope shown in the drawing, when TEM images are taken at various tilt angles of the specimen, the amount of defocus $\Delta f$ is switched to plural amounts $\Delta f_1$, $\Delta f_2$, and $\Delta f_3$, in turn, unlike the prior art in which the amount of defocus $\Delta f$ is fixed. The amounts of defocus $\Delta f_1$, $\Delta f_2$, and $\Delta f_3$ have been previously found for the specimen to be imaged, and are intrinsic to the imaged specimen. In addition, in the three-dimensional image reconstruction of the present invention, one optimum TEM image is selected according to the operator's visual judgment at each tilt angle of the specimen. Based on the selected TEM images, a three-dimensional image is reconstructed. The present invention having features described so far makes it possible to obtain a three-dimensional image with better image quality than heretofore.

It is to be understood that the present invention is not limited to the above-described embodiment. In the above embodiment, three amounts of defocus $\Delta f_1$, $\Delta f_2$, and $\Delta f_3$ are found. More amounts of defocus may be found.

The amounts of defocus may also be previously found in the manner described below. Plural amounts of defocus are found. The maximum and minimum amounts of defocus among the found amounts of defocus are adopted. Plural amounts of defocus are set at regular intervals between the maximum and minimum amounts of defocus.

In the embodiment described above, the amount of defocus is set while observing the TEM images taken by the TV camera. The amount of defocus may also be set while observing TEM images projected onto a fluorescent screen.

Having thus described my invention with the detail and particularity required by the Patent Laws, what is desired protected by Letters Patent is set forth in the following claims.

The invention claimed is:

1. A method of three-dimensional image reconstruction for reconstructing a three-dimensional image of a specimen based on TEM (transmission electron microscope) images by tilting the specimen at plural tilt angles and obtaining the TEM images at these tilt angles, wherein
   (a) a positive focal point position of an objective lens incorporated in a transmission electron microscope is detected at each of the tilt angles of the specimen,
   (b) a focal point position of the objective lens is set to plural positions which are shifted from said positive focal point position by amounts of defocus $\Delta f_1$, ..., $\Delta f_n$, respectively, at each of the tilt angles of the specimen and a TEM image is obtained at each of the set focal point positions,
   (c) a single optimum TEM image is selected at each of the tilt angles of the specimen from the TEM images obtained by the steps (a) and (b) above, and
   (d) a three-dimensional image of the specimen is reconstructed based on the selected TEM images.

2. A method of three-dimensional image reconstruction as set forth in claim 1, wherein said amount of defocus $\Delta f_1$ is previously found by performing the steps of:
   setting the tilt angle of the specimen to an arbitrary angle $\theta_1$;
   detecting the positive focal point position $f_1$ of the objective lens at the set tilt angle $\theta_1$ of the specimen; and
   varying an excitation current flowing through the objective lens such that an optimum TEM image is obtained and finding the amount of defocus $\Delta f_1$ from the difference between the focal point position of the objective lens occurring at this time and said positive focal point position $f_1$,
   wherein amounts of defocus other than $\Delta f_1$ are previously found in the same way as $\Delta f_1$.

3. A transmission electron microscope for reconstructing a three-dimensional image of a specimen by tilting the specimen at plural tilt angles, obtaining a TEM image at each of the tilt angles, and reconstructing the three-dimensional image based on the obtained TEM images, said transmission electron microscope comprising:
   defocus amount storage means for storing plural amounts of defocus $\Delta f_1$, ..., $\Delta f_n$;
   positive focal point position detection means for detecting a positive focal point position of an objective lens at each of said tilt angles of the specimen;

focal point position-setting means for setting a focal point position of the objective lens to positions shifted from the positive focal point position detected by said positive focal point position detection means by said amounts of defocus $\Delta f_1, \ldots, \Delta f_n$, at each of said tilt angles of the specimen;

an image memory for storing TEM images obtained at the focal points set by said focal point position-setting means in a corresponding manner to the respective tilt angles of the specimens;

display means for displaying the TEM images stored in the image memory;

image selection means for selecting one TEM image from the TEM images displayed on the display means at each of the tilt angles of the specimen; and three-dimensional image reconstruction means for reconstructing a three-dimensional image of the specimen based on the TEM images selected by said image selection means.

* * * * *

UNITED STATES PATENT AND TRADEMARK OFFICE
CERTIFICATE OF CORRECTION

| | |
|---|---|
| PATENT NO. | : 7,154,092 B2 |
| APPLICATION NO. | : 11/206363 |
| DATED | : December 26, 2006 |
| INVENTOR(S) | : Furukawa |

Page 1 of 1

It is certified that error appears in the above-identified patent and that said Letters Patent is hereby corrected as shown below:

Column 6, Line 47, Claim 2, "focal point position f," should read -- focal point position $f_1$ --

Signed and Sealed this

Twenty-sixth Day of February, 2008

JON W. DUDAS
*Director of the United States Patent and Trademark Office*